(12) United States Patent
Ueki et al.

(10) Patent No.: US 8,898,895 B2
(45) Date of Patent: Dec. 2, 2014

(54) METHOD FOR PRODUCING MULTILAYER SUBSTRATE AND DESMEARING METHOD

(71) Applicant: FUJIFILM Corporation, Tokyo (JP)

(72) Inventors: Shiki Ueki, Ashigara-kami-gun (JP); Takeshi Hama, Ashigara-kami-gun (JP); Takeyoshi Kano, Ashigara-kami-gun (JP)

(73) Assignee: FUJIFILM Corporation, Tokyo (JP)

( * ) Notice: Subject to any disclaimer, the term of this patent is extended or adjusted under 35 U.S.C. 154(b) by 0 days.

(21) Appl. No.: 13/968,664

(22) Filed: Aug. 16, 2013

(65) Prior Publication Data

US 2013/0326874 A1 Dec. 12, 2013

Related U.S. Application Data

(63) Continuation of application No. PCT/JP2012/050955, filed on Jan. 18, 2012.

(30) Foreign Application Priority Data

Feb. 18, 2011 (JP) ................. 2011-032915

(51) Int. Cl.
| | | |
|---|---|---|
| *H01R 9/00* | (2006.01) | |
| *H05K 3/00* | (2006.01) | |
| *H05K 3/46* | (2006.01) | |
| *H05K 3/42* | (2006.01) | |
| *H05K 3/10* | (2006.01) | |

(52) U.S. Cl.
CPC ............ *H05K 3/4685* (2013.01); *H05K 3/4652* (2013.01); *H05K 3/421* (2013.01); *H05K 3/108* (2013.01); *H05K 3/423* (2013.01)
USPC ..................... 29/842; 29/831; 29/846; 29/852

(58) Field of Classification Search
CPC .................. H05K 3/427; H05K 3/108; H05K 2201/09563; H05K 3/181; H05K 3/424; H05K 3/384; H05K 3/423; H05K 3/4644; H05K 3/387; H05K 3/067; H05K 2203/0723; C25D 7/123; C23C 18/22; C23C 18/31
USPC ............ 29/842, 830, 831, 846, 852; 174/251, 174/257, 264; 205/81, 96, 125
See application file for complete search history.

(56) References Cited

U.S. PATENT DOCUMENTS 6,398,935 B1 * 6/2002 Downes ........................ 205/81
7,230,188 B1 * 6/2007 En et al. ....................... 174/257

FOREIGN PATENT DOCUMENTS

| JP | 2002-50603 A | 2/2002 |
| JP | 2008-277717 A | 11/2008 |
| JP | 2010-87285 A | 4/2010 |

OTHER PUBLICATIONS

Notification of Reasons for Refusal, dated Mar. 18, 2014, issued in corresponding JP Application No. 2011-032915, 3 pages in English and Japanese.

(Continued)

*Primary Examiner* — Thiem Phan
(74) *Attorney, Agent, or Firm* — Sughrue Mion, PLLC

(57) ABSTRACT

A method for producing a multilayer substrate involves: a base-material pretreatment step in which a hole forming step and a metal adhesion step are performed in no particular order, the hole forming step being a step of subjecting a core base material having at least an insulating layer and a first metal layer to a hole opening process, the metal adhesion step being a step in which a predetermined metal or metal ion is made to adhere to the other surface of the insulating layer; a desmearing step of performing desmearing by plasma etching; a cleaning step of cleaning the core base material by using an acidic solution; and a plating step of applying a plating catalyst or a precursor thereof onto the insulating layer and performing plating.

11 Claims, 6 Drawing Sheets

(56) References Cited

OTHER PUBLICATIONS

International Search Report for PCT/JP2012/050955 dated Mar. 13, 2012 English Translation.

International Preliminary Report on Patentability and Written Opinion, mailed Aug. 29, 2013, issued in corresponding International Application No. PCT/JP2012/050955, 6 pages in English.

* cited by examiner

METHOD FOR PRODUCING MULTILAYER SUBSTRATE AND DESMEARING METHOD

BACKGROUND OF THE INVENTION

The present invention relates to a method for producing a multilayer substrate and a desmearing method.

Upon manufacture of a multilayer circuit board, permanganate treatment or other roughening treatment (e.g., desmear etching) is commonly used to develop the adhesion to interconnects while removing resin residues on the bottom of via holes.

However, when metal etching processes such as a subtractive process and a semi-additive process are applied for miniaturization of interconnects, the adhesion of the interconnects is reduced and metal residues catching on the roughened surface between the interconnects are difficult to remove and therefore overetching is more likely to occur during etching, making it difficult to form fine metal interconnects. Roughening under the interconnects is thus considerably disadvantageous.

Then, methods for removing resin residues remaining in via holes using plasma etching as another desmear treatment have been proposed (JP 2008-277717 A and JP 2002-50603 A).

SUMMARY OF THE INVENTION

The inventors of the invention formed via holes in a conducting substance-adsorbing resin layer and performed plasma etching treatment as the desmear treatment by reference to Patent Literature 1, and found that "film reduction", that is, reduction in the thickness of the resin layer occurred to cause damage to the resin layer. As a result, the adhesion of a metal layer formed on the resin layer and the patternability of the metal layer were reduced. In addition, a filling defect of the via holes often occurred.

In view of the situation as described above, an object of the invention is to provide a method for producing a multilayer substrate which is excellent in the adhesion of metal layers formed and high-definition patterning, provides high reliability in connections between the metal layers though holes, and has a good yield. Another object of the invention is to provide a desmearing method that may be used in the foregoing production method.

The inventors of the invention have made an intensive study on the prior art problems and as a result found that the film reduction of an insulating layer can be suppressed by performing plasma etching after depositing metal ingredients on the surface of the insulating layer.

The inventors of the invention have found that the foregoing objects can be achieved by the following means.

(1) A method for producing a multilayer substrate, comprising:
a base pretreatment step in which two steps are performed in random order, the two steps including a boring step for boring a core base having at least an insulating layer disposed as an uppermost layer and a first metal layer provided on one surface of the insulating layer to form in the insulating layer holes each extending from the other surface of the insulating layer to the first metal layer, and a metal deposition step for depositing a metal selected from the group consisting of metals having an atomic number of 13 to 14, 21 to 33 and 39 to 50 or an ion thereof on the other surface of the insulating layer;
a desmearing step for performing desmear treatment by plasma etching after the base pretreatment step;
a cleaning step for cleaning the core base with an acidic solution after the desmearing step; and
a plating step for applying a plating catalyst or its precursor to the insulating layer to perform plating treatment to thereby form on the insulating layer a second metal layer electrically connecting with the first metal layer through the holes.

(2) The method for producing the multilayer substrate according to (1), wherein the acidic solution contains hydrochloric acid, sulfuric acid or nitric acid.

(3) The method for producing the multilayer substrate according to (1) or (2), wherein the metal or the ion thereof is deposited in the metal deposition step in an amount of 50 to 1,000 mg/m$^2$.

(4) The method for producing the multilayer substrate according to any one of (1) to (3), wherein the insulating layer is one including, as its uppermost layer, at least an adhesive insulating layer having a functional group that may interact with the plating catalyst or its precursor.

(5) The method for producing the multilayer substrate according to any one of (1) to (4), wherein the core base is bored by drilling or laser machining.

(6) A method for removing smear of a base including at least an insulating layer disposed as an uppermost layer and a first metal layer provided on one surface of the insulating layer,
wherein two steps including a boring step for boring the base to form in the insulating layer holes each extending from the other surface of the insulating layer to the first metal layer, and a metal deposition step for depositing a metal selected from the group consisting of metals having an atomic number of 13 to 14, 21 to 33 and 39 to 50 or an ion thereof on the other surface of the insulating layer are performed in random order and are followed by plasma etching.

The invention can provide a method for producing a multilayer substrate which is excellent in the adhesion of metal layers formed and high-definition patterning, provides high reliability in connections between the metal layers though holes, and has a good yield. The invention can also provide a desmearing method that may be used in the foregoing production method.

DETAILED DESCRIPTION OF THE INVENTION

Figure 1A:
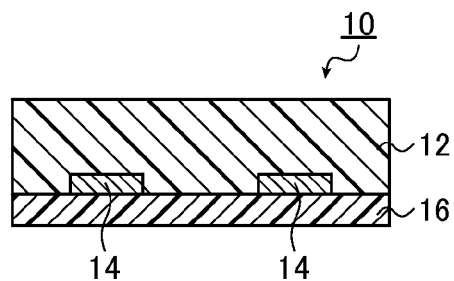
FIGS. 1A to 1G are schematic cross-sectional views showing in order respective production steps in a method for producing a multilayer substrate of the invention.

The method for producing a multilayer substrate according to the invention is described below.

The characteristic features of the invention compared to the prior art are first described in detail.

The invention is characterized in that a metal or a metal ion is deposited on the surface of an insulating layer as a pretreatment of desmear treatment using plasma etching and that an acidic solution is contacted with a core base after the desmear treatment. First, deposition of the metal or the metal ion on the surface of the insulating layer enables damage to the insulating layer due to plasma etching to be reduced while suppressing occurrence of film reduction. In addition, by contacting the acidic solution with the core base after desmear treatment, the metal or metal ion on the insulating layer as well as resin residues deposited on the bottom of holes and an oxide film formed on the surface of a first metal layer (for example, copper oxide when the first metal layer is a copper layer) can be removed.

First Embodiment

The method for producing a multilayer substrate according to the invention includes the following four steps:
(Base pretreatment step) a step which includes a boring step for boring a core base having at least an insulating layer disposed as the uppermost layer and a first metal layer provided on one surface of the insulating layer to form in the insulating layer holes each extending from the other surface of the insulating layer to the first metal layer, and a metal deposition step for depositing a metal selected from the group consisting of metals having an atomic number of 13 to 14, 21 to 33 and 39 to 50 or an ion thereof on the other surface of the insulating layer, and in which the two steps are performed in random order;
(Desmearing step) a step for performing desmear treatment by plasma etching after the base pretreatment step;
(Cleaning step) a step for cleaning the core base with an acidic solution after the desmearing step; and
(Plating step) a step for applying a plating catalyst or its precursor to the insulating layer to perform plating treatment to thereby form on the insulating layer a second metal layer electrically connecting with the first metal layer through the holes.

The materials used in the respective steps and the operation methods are described below in detail.

<Base Pretreatment Step>

The base pretreatment step is the step which includes the boring step and the metal deposition step to be described later and in which these two steps are performed in random order. The order in which the boring step and the metal deposition step are performed is not particularly limited but the boring step is preferably followed by the metal deposition step in terms of further suppressing occurrence of smear due to metal deposited during the boring step.

The boring step and the metal deposition step are described below in detail. FIG. 1 shows the embodiment in which the boring step is first performed.

<Boring Step>

The boring step is the step for boring a core base having at least an insulating layer disposed as the uppermost layer (outermost layer) and a first metal layer provided on one surface of the insulating layer to form in the insulating layer holes each extending from the other surface of the insulating layer to the first metal layer.

Figure 1E:
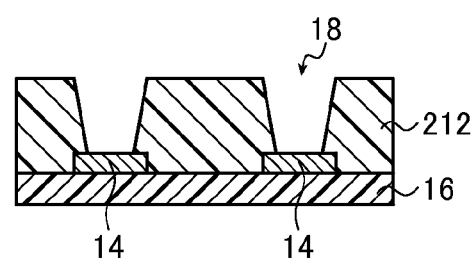
Figure 1B:
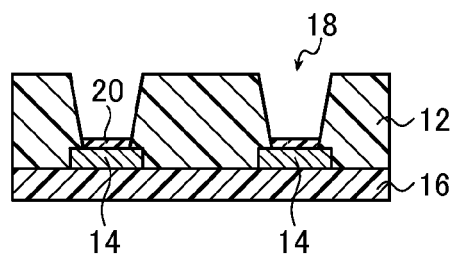

More specifically, a core base 10 including an insulating layer 12 disposed as the uppermost layer, a first metal layer 14 provided on one surface (back surface) of the insulating layer 12, and a support 16 for supporting the insulating layer 12 and the metal layer 14 is first prepared as shown in FIG. 1A. Then, the core base 10 is bored (from the surface thereof opposite from the surface having the first metal layer 14) to form, as shown in FIG. 1B, holes 18 each extending from the surface (front surface) of the insulating layer 12 opposite from the surface having the first metal layer 14 to the first metal layer 14. The holes 18 are formed to establish electrical connection between a second metal layer 22 to be formed on the insulating layer 12 which will be described later and the first metal layer 14. Smear 20 is deposited on the bottom of the holes by performing this treatment (see FIG. 1B).

The core base that may be used in this step is first described in detail and the procedure of the step is then described in detail.

(Core Base)

The core base is the base including at least the insulating layer disposed as the uppermost layer and the first metal layer provided on one surface of the insulating layer. In other words, the core base includes at least the insulating layer and the first metal layer provided on one surface of the insulating layer and the insulating layer is disposed as the outermost layer. By performing the production method of the invention, another metal layer is further provided on the insulating layer which is disposed as the uppermost layer of the base.

Now, an embodiment of the core base is first described in detail with reference to FIG. 1A.

The insulating layer 12 and the first metal layer 14 are provided on one surface of the support 16 in FIG. 1A but may be provided on both surfaces thereof. In the latter case, the first metal layer 14 provided on one surface of the support 16 may be electrically connected with a first metal layer provided on the other surface via a through conductor passing through the support 16.

(Insulating Layer)

The insulating layer is the layer which is disposed as the uppermost layer (outermost layer) of the core base and is provided to ensure the insulation reliability between metal layers.

The material making up the insulating layer is not particularly limited and examples thereof include insulating resins such as thermosetting resins and thermoplastic resins. More specifically, exemplary thermosetting resins include epoxy resin, phenol resin, polyimide resin, polyester resin, bismaleimide resin, polyolefin resin, and isocyanate resin. Exemplary thermoplastic resins include phenoxy resin, polyethersulfone, polysulfone, polyphenylene sulfone, polyphenylene sulfide, polyphenyl ether, and polyetherimide.

The method for forming the insulating layer is not particularly limited and examples thereof include a method which involves applying an insulating resin composition containing an insulating resin to a support to form an insulating layer (coating process) and a method which involves laminating an insulating layer containing an insulating resin on a support.

The thickness of the insulating layer is selected as appropriate for the intended use of the multilayer substrate and is preferably from 10 to 150 μm and more preferably from 20 to 100 μm.

The "insulating resin" as used in the invention refers to a resin having sufficient insulating properties to enable the use in known insulating films and insulating layers, and may be applied to the invention even if it is not a complete insulator as long as it has the insulating properties suitable to the purpose.

The insulating resin composition may further contain, if necessary, one or more than one additive selected from among various additives including fillers (e.g., silica, alumina, clay and talc), colorants, flame retardants, adhesion promoters, silane coupling agents, antioxidants and UV absorbers.

When added to the insulating resin composition, these materials are preferably added in amounts of 1 to 200 wt % and more preferably 10 to 80 wt % with respect to the resin.
(First Metal Layer)

The first metal layer is the metal layer provided on one surface of the insulating layer. The first metal layer mainly functions as a metal interconnect on the multilayer substrate. The metal layer may be provided in a pattern (e.g., in the shape of a land) as shown in FIG. 1A or on the whole surface of the insulating layer. The patterned metal layer may be formed by any of known processes including the subtractive process and the semi-additive process.

The material making up the first metal layer is not particularly limited and examples thereof include copper, silver, tin, nickel and gold.

The thickness of the first metal layer is not particularly limited and is preferably from about 4 μm to about 50 μm in terms of the practical utility in printed circuit boards.
(Support)

The support is a member for supporting the insulating layer and the first metal layer and is provided as needed. In other words, the support is an optional constituent member.

The type of the support is not particularly limited and examples thereof include a glass epoxy substrate, a BT resin substrate, an alumina substrate, a polyimide film, a polyamide film, a liquid crystal film and an aramid film. In particular, a glass epoxy substrate and a BT resin substrate are preferable in terms of the thermal or mechanical properties such as dimensional stability or heat resistance.
(Step Procedure)

The method of boring the above-described core base is not particularly limited and known methods such as chemical etching and plasma etching are applied. In particular, laser machining or drilling is preferable in terms of facilitating the control of the size of the diameter of holes to be formed and their positioning.

The laser for use in the laser machining is not particularly limited as long as it can remove the insulating layer and form holes having a desired diameter. The emission wavelength of the laser is not particularly limited and an emission wavelength in a range of 100 nm to 15 μm may be advantageously used.

In particular, lasers such as an excimer laser, a carbon dioxide laser ($CO_2$ laser), a YAG laser, an Nd:YAG laser and a UV-YAG laser may be used because they are excellent in workability, in other words, they are capable of efficient ablation and have excellent productivity. Of these, a carbon dioxide laser and a UV-YAG laser are preferable in terms of cost reduction.

Drilling is not particularly limited as long as it is capable of removing the insulating layer and forming holes having a desired diameter, and spin drilling is commonly used in terms of productivity and workability of small-diameter via holes.

Optimal diameters are appropriately selected for the holes to be formed in this step according to the intended use and it is preferred for the top diameter ($\Phi$) to be from 10 to 150 μm and more preferably from 10 to 60 μm and for the bottom diameter ($\Phi$) to be from 10 to 150 μm and more preferably from 10 to 60 μm in terms of a smaller substrate size and a higher interconnect density.
<Metal Deposition Step>

The metal deposition step is the step for depositing a specified metal or metal ion on the other surface of the insulating layer (the surface opposite from the surface having the first metal layer). The metal or metal ion deposited on the surface of the insulating layer suppresses damage to the insulating layer due to plasma etching treatment to be described later.

Figure 1F:
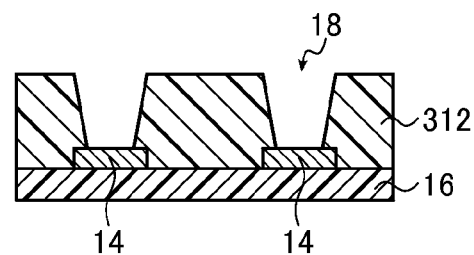
Figure 1C:
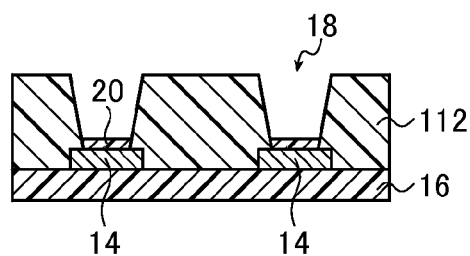

By performing this step, an insulating layer 112 having the metal or metal ion deposited on the surface thereof is obtained as shown in FIG. 1C.

The materials used (metals or metal ions) are first described in detail and the procedure of the step is then described in detail.
(Metal or Metal Ion)

As for the metal or metal ion for use in this step, a metal selected from metallic elements having an atomic number of 13 to 14, 21 to 33 and 39 to 50 or a metal ion thereof is used. Of these, a metal selected from transition metal elements (elements having an atomic number of 21 to 29 and 39 to 47) or its ion is more preferred in terms of further preventing damage to the insulating layer due to plasma etching treatment.

In terms of more excellent effects of the invention, transition metal elements of Groups 10 and 11 of the Periodic Table are even more preferred and palladium, copper, silver and nickel are most preferred.

Use of the other metals or metal ions (e.g., alkali metals and alkaline-earth metals) causes damage to the insulating layer, whereby a desired effect cannot be obtained.
(Step Procedure)

The method of depositing the metal or the metal ion on the surface of the insulating layer is not particularly limited, and examples thereof include a method which involves applying a metal- or metal ion-containing solution onto the insulating layer and a method which involves immersing a base in the foregoing solution.

The coating weight of the metal or metal ion on the insulating layer is preferably from 50 to 1,000 mg/m$^2$ and more preferably from 100 to 500 mg/m$^2$ in terms of further preventing damage to the insulating layer due to plasma etching treatment.
<Desmearing Step>

The desmearing step is the step for performing desmear treatment by plasma etching after the base pretreatment step (after metal deposition step in the embodiment of FIG. 1). By performing this step, the smear 20 deposited on the bottom of the holes 18 can be removed as shown in FIG. 1D.

The plasma etching process is not particularly limited and any known process is performed. For example, any of a low-pressure plasma process and an atmospheric plasma process may be applied but the low-pressure plasma process which is widely used is utilized with advantage.

The ambient pressure in plasma etching treatment is preferably up to 100 Pa and more preferably up to 10 Pa in terms of the etching rate.

In the case of using the atmospheric pressure plasma process, the pressure is not necessary to reduce, which offers therefore the advantage of enabling in-line treatment, whereby an improvement of the production efficiency can be expected.

In this treatment, use can be made of at least one gas selected from the group consisting of an inert gas selected from among helium, argon, krypton and xenon, $O_2$, $CF_4$, $C_2F_4$, $N_2$, $CO_2$, $SF_6$, $CHF_3$, and a reactive gas containing at least O, N, F or Cl. These may be used alone or as a mixture of two or more.

The time for plasma etching is appropriately selected and is usually from about 15 to about 300 seconds in many cases.
[Cleaning Step]

The cleaning step is the step for cleaning the core base having undergone desmear treatment with an acidic solution after the desmearing step. By performing this step, the metal or metal ion deposited on the surface of the insulating layer is substantially removed (the insulating layer 112 having the metal or metal ion deposited on the surface thereof is turned into an insulating layer 212 in which the metal or metal ion is substantially removed) while the resin remaining on the bottom of the holes 18 and the oxide film formed on the first metal layer 14 are removed, as shown in FIG. 1E.

The material (acidic solution) that may be used in this step is first described in detail and the procedure of the step is then described in detail.

(Acidic Solution)

The acidic solution need only be acidic. In particular, the pH is preferably 2 or less and more preferably 1 or less because the oxide film removing performance is more excellent. The lower limit is not particularly limited but the pH is preferably 0 or more in terms of the effects on the insulating layer.

Acidic ingredients contained in the acidic solution are not particularly limited and examples thereof include acetic acid, hydrochloric acid, sulfuric acid, and nitric acid. In particular, the acidic solution preferably contains hydrochloric acid, sulfuric acid or nitric acid because the oxide film removing performance is more excellent.

The solvent used in the acidic solution is usually water but an organic solvent (e.g., an alcoholic solvent) may be used as needed.

(Step Procedure)

The method of cleaning the core base is not particularly limited and examples thereof include a method which involves applying the foregoing acidic solution to the surface of the core base and a method which involves immersing the core base in the foregoing acidic solution.

The time of contact between the core base and the acidic solution is selected as appropriate for the metal used or other factor and is preferably from 1 to 30 minutes and more preferably from 3 to 15 minutes in terms of the productivity and the removal performance of the oxide film or the like.

<Plating Step>

The plating step is the step for applying a plating catalyst or its precursor to the insulating layer of the core base having undergone the cleaning step to perform plating treatment to thereby form on the insulating layer a second metal layer electrically connecting with the first metal layer through the holes.

Figure 1G:
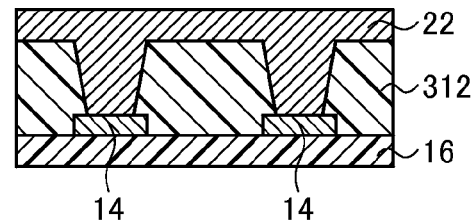
Figure 1D:
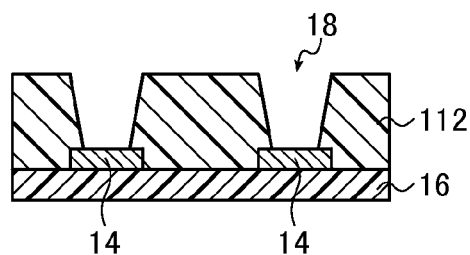

More specifically, an insulating layer 312 to which the plating catalyst or its precursor is applied is first formed, as shown in FIG. 1F. Then, the second metal layer 22 coming in contact with and electrically connecting with the first metal layer 14 via the holes 18 is formed on the insulating layer 312, as shown in FIG. 1G.

The step A for applying the plating catalyst or its precursor to the insulating layer and the step B for plating treatment which make up this step are separately described below in detail.

<Step A>

In the step A, the plating catalyst or its precursor is applied to the insulating layer.

The materials that may be used in this step are first described below in detail and the procedure of the step is then described in detail.

(Plating Catalyst or its Precursor)

The plating catalyst or its precursor functions as the plating catalyst or electrode in plating treatment to be described later. Therefore, the type of the plating catalyst or its precursor that may be used is determined as appropriate for the type of plating.

The plating catalyst or its precursor that may be used in this step is preferably an electroless plating catalyst or its precursor. In particular, the plating catalyst or its precursor is preferably a Pd-, Ag- or Cu-containing compound in terms of the reduction potential.

The electroless plating or its precursor is first described below in detail.

(Electroless Plating Catalyst)

Any electroless plating catalyst may be used as long as it serves as the active nucleus during the electroless plating. More specifically, a metal which is capable of catalyzing the autocatalytic reduction reaction and which is known as a metal capable of electroless plating with lower ionization tendency than Ni may be used. Specific examples thereof include Pd, Ag, Cu, Ni, Al, Fe and Co. Of these, metals capable of multidentate coordination are preferred and Ag, Pd and Cu are most preferred in terms of the number of types of functional groups capable of coordination and the high catalytic activity.

A metallic colloid may be used as the electroless plating catalyst. In general, the metallic colloid can be prepared by reducing metal ions in a solution containing a charged surfactant or a charged protective agent. The charge of the metallic colloid can be adjusted by the surfactant or the protective agent used herein.

(Electroless Plating Catalyst Precursor)

The electroless plating catalyst precursor can be used without any particular limitation as long as it may be converted into the electroless plating catalyst by a chemical reaction. Metal ions of the metals illustrated above for the electroless plating catalyst are mainly used. The metal ions which are the electroless plating catalyst precursors are converted by the reduction reaction into zero-valent metals as the electroless plating catalysts. After the metal ion as the electroless plating catalyst precursor is applied to the insulating layer, the electroless plating catalyst precursor may be separately converted into a zero-valent metal as the electroless plating catalyst by the reduction reaction before being immersed in the electroless plating bath. Alternatively, the electroless plating catalyst precursor may be immersed into the electroless plating bath without any treatment to be converted into a metal (electroless plating catalyst) by the action of the reducing agent in the electroless plating bath.

A metal salt is preferably used to apply the metal ion as the electroless plating catalyst precursor to the insulating layer 212 (to the inside and the surface of the insulating layer 212). The metal salt used is not particularly limited as long as it dissolves in a suitable solvent to be dissociated into a metal ion and a base (anion). Examples thereof include $M(NO_3)_n$, $MCl_n$, $M_{2/n}(SO_4)$ and $M_{3/n}(PO_4)Pd(OAc)_n$ (M represents an n-valent metal atom). The metal ion resulting from the dissociation of the metal salt may be advantageously used. Specific examples of the metal ion include Ag ion, Cu ion, Al ion, Ni ion, Co ion, Fe ion, and Pd ion. Among these, ions capable of multidentate coordination are preferred. Ag ion and Pd ion are particularly preferred in terms of the number of types of functional groups capable of coordination and the catalytic activity.

A preferable example of the electroless plating catalyst or its precursor that may be used in the invention includes a palladium compound. The palladium compound serves as an active nucleus during the plating treatment to deposit the metal and functions as the plating catalyst (palladium) or its precursor (palladium ion). The palladium compound is not particularly limited as long as it contains palladium and serves as the nucleus during the plating treatment. Examples thereof include a palladium (II) salt, a palladium (0) complex and a palladium colloid.

Examples of the palladium salt include palladium acetate, palladium chloride, palladium nitrate, palladium bromide, palladium carbonate, palladium sulfate, bis(benzonitrile)dichloropalladium (II), bis(acetonitrile)dichloropalladium (II) and bis(ethylenediamine)palladium (II) chloride. Of these, palladium nitrate, palladium acetate, palladium sulfate and bis(acetonitrile)dichloropalladium (II) are preferred in terms of the ease of handling and solubility.

Examples of the palladium complex include tetrakis(triphenylphosphine)palladium complex and tris(benzylideneacetone)dipalladium complex.

The palladium colloid is composed of palladium (0) particles. The particle size is not particularly limited and is preferably from 5 nm to 300 nm and more preferably from 10 nm to 100 nm in terms of the stability in the liquid. The palladium colloid may optionally contain other metals such as tin. An example of the palladium colloid includes a tin-palladium colloid. The palladium colloid may be synthesized by any known method or a commercially available product may be used. The palladium colloid can be prepared by reducing palladium ions in a solution containing a charged surfactant or a charged protective agent.

(Other Catalysts)

Zero-valent metals other than the above may be used for the catalyst for use in directly performing electroplating without through electroless plating.

(Step Procedure)

The method of applying the plating catalyst or its precursor to the insulating layer is not particularly limited.

Examples thereof include a method which involves preparing a dispersion of a metal in a suitable dispersion medium or a solution of a metal salt dissociated into a metal ion in a suitable solvent, and applying the dispersion or the solution (hereinafter referred to as the "plating catalyst solution" where appropriate) to the insulating layer and a method which involves immersing the base having the insulating layer formed thereon in the dispersion or the solution.

The time of contact between the insulating layer and the plating catalyst solution is preferably from about 30 seconds to about 20 minutes, and more preferably from about 1 minute to about 10 minutes.

The temperature of the plating catalyst solution at the time of contact is preferably from about 10 to about 60° C. and more preferably from about 10 to about 30° C.

Alkali degreasing treatment may be performed as needed prior to the foregoing treatment.

Water and organic solvents are used for the solvent of the plating catalyst solution.

The organic solvent contained contributes to improving the permeability of the plating catalyst solution through the insulating layer, thereby enabling the plating catalyst or its precursor to be efficiently applied.

Water for use in the plating catalyst solution preferably contains no impurities and in this regard, it is preferable to use RO water, deionized water, distilled water or purified water, and most preferably deionized water or distilled water.

The organic solvent that may be used to prepare the plating catalyst solution is not particularly limited as long as it is a solvent that can permeate the insulating layer. Examples of the solvent that may be used include acetone, methyl acetoacetate, ethyl acetoacetate, ethylene glycol diacetate, cyclohexanone, acetylacetone, acetophenone, 2-(1-cyclohexenyl), propylene glycol diacetate, triacetin, diethylene glycol diacetate, dioxane, N-methylpyrrolidone, dimethyl carbonate and dimethyl cellosolve.

The content of the solvent in the plating catalyst solution is preferably from 0.5 to 40 wt %, more preferably from 5 to 30 wt % and most preferably from 5 to 20 wt % with respect to the total amount of the plating catalyst solution.

<Step B>

The step B is a step in which the base obtained in the step A (in particular the insulating layer to which the plating catalyst or its precursor is applied) is plated.

Exemplary types of plating treatment performed in this step include electroless plating and electrolytic plating. The type of plating can be selected as appropriate for the function of the plating catalyst or its precursor which was applied to the insulating layer.

It is particularly preferred to perform electroless plating in terms of improving the adhesion of the metal layer to be formed. In a more preferred embodiment, electroless plating is further followed by electrolytic plating in order to obtain the metal layer with a desired thickness.

The plating advantageously performed in this step is described below.

(Electroless Plating)

Electroless plating refers to an operation in which a metal is deposited by a chemical reaction using a solution containing metal ions to be deposited by plating.

Electroless plating in this step is performed by, for example, washing the core base to which the electroless plating catalyst has been applied with water to remove excess electroless plating catalyst (metal), and then immersing the core base in an electroless plating bath. Any known electroless plating bath may be used as the electroless plating bath used. As for the electroless plating bath, the case in which an alkaline electroless plating bath (preferably having a pH of about 9 to about 14) is preferable in terms of easy availability.

In a case where the core base to which the electroless plating catalyst precursor has been applied is immersed in the electroless plating bath with the electroless plating catalyst precursor adsorbed onto or impregnated into the insulating layer, the core base is washed with water to remove excess precursor (metal salt or the like) prior to the immersion in the electroless plating bath. In this case, reduction of the plating catalyst precursor and the subsequent electroless plating are performed in the electroless plating bath. Any known electroless plating bath may be used as above for the electroless plating bath used herein.

Instead of the embodiment using the above-described electroless plating solution, it is also possible to reduce the electroless plating catalyst precursor as a separate step preceding the electroless plating by preparing a catalyst activating solution (reducing solution). The catalyst activating solution is a solution containing a reducing agent which can reduce the electroless plating catalyst precursor (mainly a metal ion) to a zero-valent metal, and the concentration of the reducing agent is preferably from 0.1 to 50 wt % and more preferably from 1 to 30 wt % with respect to the total solution. Examples of the reducing agent that may be used include boron-based reducing agents such as sodium borohydride and dimethylamine borane, and other reducing agents such as formaldehyde and hypophosphorous acid.

In the immersion, the core base is preferably immersed in the plating bath as it is stirred or shaken in order to keep the electroless plating catalyst or its precursor in the vicinity of the surface of the insulating layer with which the electroless plating catalyst or its precursor is contacted at a constant concentration.

In addition to the solvent (e.g., water), the general composition of the electroless plating bath mainly includes, for example, 1. a metal ion for plating, 2. a reducing agent, and 3. an additive enhancing the stability of the metal ion (stabilizer). In addition to these ingredients, this plating bath may contain known additives such as a stabilizer for the plating bath.

The organic solvent that may be used in the plating bath is to be soluble in water and in view of this, ketones such as acetone, and alcohols such as methanol, ethanol and isopropanol are preferably used.

For example, copper, tin, lead, nickel, gold, silver, palladium and rhodium are known metals that may be used in the electroless plating bath. Of these, copper and gold are particularly preferred in terms of electrical conductivity. The most appropriate reducing agent and additives are selected for the metal used.

The thickness of the metal layer thus formed by electroless plating can be controlled by adjusting the metal ion concentration in the plating bath, the immersion time in the plating bath, or the temperature of the plating bath. The metal layer preferably has a thickness of at least 0.1 μm and more preferably 0.2 to 2 μm in terms of electrical conductivity.

However, in cases where the metal layer formed by electroless plating is used as the conductive layer to perform electrolytic plating to be described below, it is preferable for a film with a thickness of at least 0.1 μm to be formed uniformly.

The immersion time in the plating bath is preferably from about 1 minute to about 6 hours and more preferably from about 1 minute to about 3 hours.

(Electrolytic Plating (Electroplating))

In this step, in cases where the plating catalyst or its precursor that has been applied in the foregoing step functions as an electrode, electrolytic plating can be performed on the insulating layer to which the catalyst or its precursor has been applied.

The foregoing electroless plating may be further followed by electrolytic plating using the formed metal layer as the electrode. In this way, a new metal layer with any thickness can be easily formed based on the film formed by electroless plating and having good adhesion to the core base. A metal layer with a thickness suitable to the intended purpose can be formed by electrolytic plating following electroless plating and therefore the metal layer can be advantageously used in various applications.

Any conventionally known method may be used for electrolytic plating. Examples of the metal that may be used in electrolytic plating include copper, chromium, lead, nickel, gold, silver, tin, and zinc. In terms of electrical conductivity, copper, gold and silver are preferred and copper is more preferred.

The thickness of the metal layer obtained by electrolytic plating can be controlled by adjusting the concentration of the metal contained in the plating bath, current density or the like.

When used in general electrical interconnects, the metal layer preferably has a thickness of at least 0.5 μm and more preferably 1 to 30 μm in terms of electrical conductivity.

The thickness of the electrical interconnects is reduced with decreasing line width of the electrical interconnects or with miniaturization in order to maintain the aspect ratio. Therefore, the thickness of the metal layer formed by electrolytic plating is not limited to the above-defined range but may be arbitrarily set.

<Multilayer Substrate>

The multilayer substrate obtained by the above-described production method of the invention has two or more metal layers and may be used in various applications including, for example, semiconductor chips, various electrical circuit boards (multilayer circuit boards), FPCs, COFs, TABs, mother boards and package interposer boards. The multilayer substrate as used in the specification refers to a substrate having two or more metal layers.

An insulating layer may be further formed as needed on the second metal layer in order to use in a circuit board. Known materials as exemplified by known interlayer dielectric film and solder resist may be used for the insulating layer.

The multilayer substrate having the two metal layers and obtained by the above-described steps may also be used as a core base for forming further interconnects by forming another insulating layer on the metal layers so that the multilayer substrate may be suitable to the mounting.

The second metal layer of the resulting multilayer substrate may be etched as needed in a pattern to form a patterned metal layer (patterning step). The patterning process is not particularly limited and known processes such as the semi-additive process and the subtractive process may be applied.

Typical forming methods for forming the patterned metal layer are described below with reference to FIGS. 2 and 3. The method of FIG. 2 is a method based on the so-called semi-additive process and the method of FIG. 3 is a method based on the so-called subtractive process.

Figure 2A:
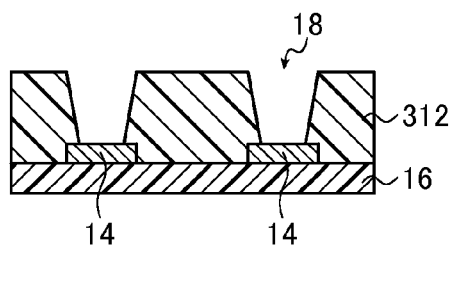
FIGS. 2A to 2F are schematic cross-sectional views showing in order respective production steps in producing a patterned metal layer based on the semi-additive process.
Figure 2B:
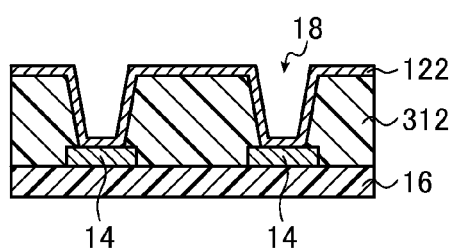
Figure 2C:
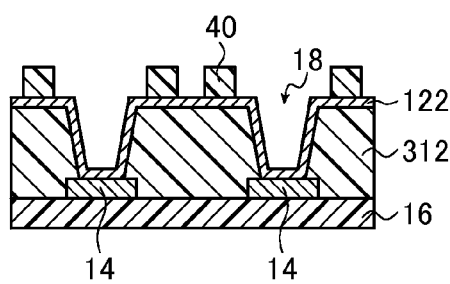
Figure 2D:
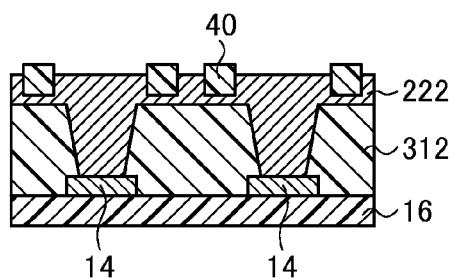
Figure 2E:
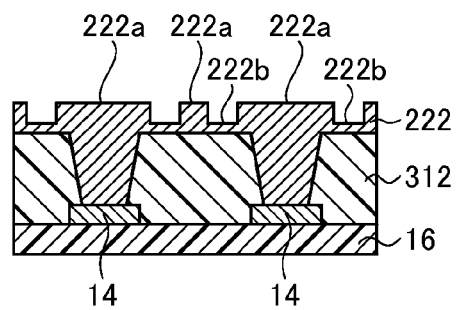
Figure 2F:
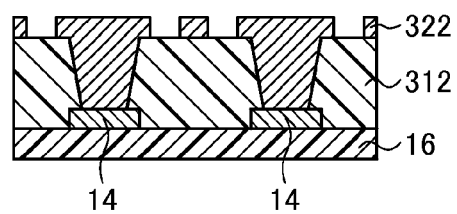

In the case based on the semi-additive process, the step A is first performed to prepare a core base including an insulating layer 312 to which a plating catalyst or its precursor is applied (FIG. 2A). Then, electroless plating is performed to form a second metal layer 122 which electrically connects with a first metal layer 14 (see FIG. 2B). Then, a patterned mask 40 is formed on the second metal layer 122 (see FIG. 2C) and electrolytic plating is performed so that a second metal layer 222 may be formed in areas where the mask 40 is not formed (mask 40-free areas) (FIG. 2D). Electrolytic plating is followed by removal of the mask 40 as shown in FIG. 2E. The second metal layer 222 including projections 222a and recesses 222b is obtained by performing these steps.

Then, the resulting second metal layer 222 having the relief structure is subjected to quick etching to remove the recesses 222b except the projections 222a corresponding to the interconnects in the second metal layer 222 thereby obtaining a patterned second metal layer 322.

Any known process may be used to perform quick etching. For example, any of wet etching (process using an etching solution) and dry etching may be used but wet etching is preferable in terms of workability. For example, an aqueous solution of sulfuric acid/hydrogen peroxide or sulfuric acid/hydrogen peroxide/cupric chloride may be used as the etching solution.

Any known resist material may be used for the mask 40. The type of the resist material is not particularly limited, and negative type, positive type, liquid type and film type resist materials may be used. The removal method of the resist layer is not particularly limited and known methods (removal with an alkaline solution and dry etching) may be used.

Figure 3A:
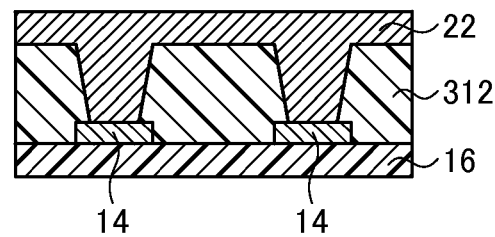
FIGS. 3A to 3D are schematic cross-sectional views showing in order respective production steps in producing a patterned metal layer based on the subtractive process.
Figure 3B:
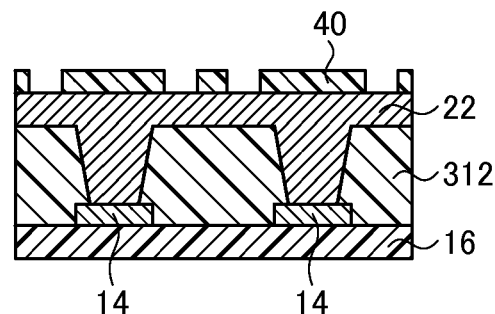
Figure 3C:
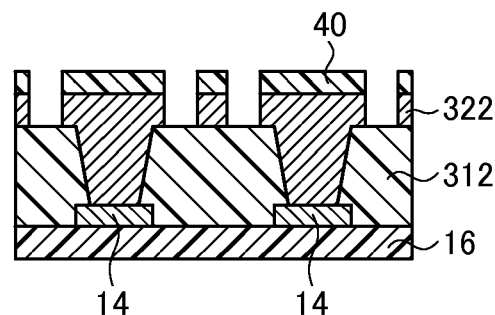
Figure 3D:
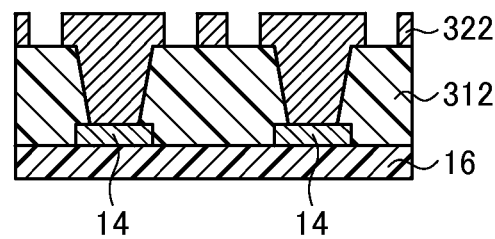

In the case based on the subtractive process, the step B is first performed to prepare a multilayer substrate in which a second metal layer 22 electrically connecting with a metal layer 14 is formed on an insulating layer 312 (FIG. 3A). Then, a mask 40 is formed at a predetermined position on the second metal layer 22 as shown in FIG. 3B. Subsequently, areas of the second metal layer 22 on which the mask 40 is not formed (mask 40-free areas) are removed by etching to obtain a patterned second metal layer 322 as shown in FIG. 3C. Subsequently, the mask 40 is removed as shown in FIG. 3D.

Second and Third Embodiments

The above-described first embodiment discloses the core base 10 including the insulating layer 12, the first metal layer 14 and the support 16 as shown in FIG. 1A but the embodiment of the core base 10 for use in the production method of the invention is not limited to this. The insulating layer 12 and the first metal layer 14 need only be at predetermined positions in the core base.

A second embodiment of the production method of the invention is an embodiment in which a multilayer laminate (laminate substrate) having a plurality of (two or more) insulating layers and metal layers alternately disposed therein is used as the core base. In the multilayer laminate, metal layers disposed above and below the insulating layer may be electrically connected with each other via a through conductor formed in the insulating layer lying between the metal layers.

Figure 4A:
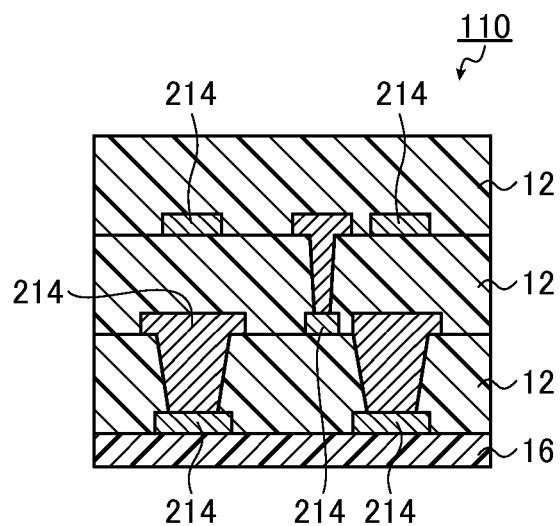
FIGS. 4A and 4B are schematic cross-sectional views showing other embodiments of a core base that may be used in the invention.

More specifically, a core base (laminate substrate) 110 as shown in FIG. 4A may be used in which insulating layers 12 and three patterned metal layers 214 are stacked on a support 16.

Figure 4B:
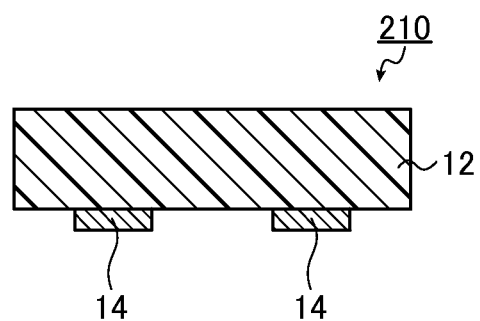

A third embodiment of the production method of the invention is an embodiment shown in FIG. 4B in which a core base 210 including an insulating layer 12 and a first metal layer 14 is used.

Fourth Embodiment

Figure 5A:
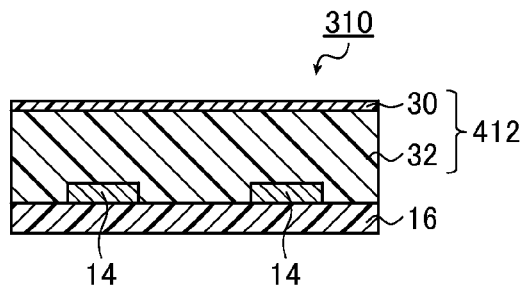
FIGS. 5A to 5G are schematic cross-sectional views showing in order respective production steps in the method for producing a multilayer substrate of the invention when a core base including an adhesive insulating layer is used.

A fourth embodiment of the production method of the invention is an embodiment in which a core base including at least an insulating layer as the uppermost layer (outermost layer) and including as the uppermost layer (outermost layer) of the insulating layer an adhesive insulating layer having a functional group that may interact with a plating catalyst or its precursor is used. More specifically, a core base 310 including a laminated insulating layer 412 having an adhesive insulating layer 30 and a lower insulating layer 32 is used as shown in FIG. 5A. In this embodiment, the insulating layer is described as the two-layered laminated insulating layer 412 but the insulating layer is not limited to this embodiment and may be a single layer composed of an adhesive insulating layer.

In this embodiment, the adhesive insulating layer 30 has a predetermined functional group and the adhesion to a second metal layer formed thereon is more excellent.

The layer constituting the core base 310 for use in this embodiment is described below in detail and the embodiment of the inventive production method in the case of using the core base 310 is then described in detail.
(Adhesive Insulating Layer)

The adhesive insulating layer 30 is a layer which is disposed as the uppermost (outermost) layer of the laminated insulating layer 412 and has a functional group that may interact with the plating catalyst or its precursor.

The adhesive insulating layer 30 adsorbs the above-described plating catalyst or its precursor with high efficiency according to the function of the functional group that may form an interaction with the plating catalyst or its precursor contained. In other words, the adhesive insulating layer 30 serves as the good receptive layer of the plating catalyst (or its precursor). As a result, an excellent adhesion to a second metal layer 22 formed on the surface of the adhesive insulating layer 30 is obtained.

The thickness of the adhesive insulating layer is not particularly limited and is preferably from 0.02 to 5.0 µm and more preferably from 0.05 to 2.0 µm in terms of the adhesion of the second metal layer.

The adhesive insulating layer preferably has a surface roughness (Ra) of 10 to 200 nm and more preferably 20 to 100 nm in terms of forming a high definition interconnect. The surface roughness (Ra) was measured by non-contact interferometry based on Ra described in JIS B 0601 (revised on Jan. 20, 2001) using SURFCOM 3000A (manufactured by Tokyo Seimitsu Co., Ltd.).

Examples of the functional group that may interact with the plating catalyst or its precursor contained in the adhesive insulating layer (this functional group will be hereinafter also referred to as the "interactive group" where appropriate) include a polar group, a group capable of multidentate coordination, a nitrogen-containing functional group, a sulfur-containing functional group, an oxygen-containing functional group and other non-dissociative functional groups (functional groups in which no proton is generated by dissociation).

Examples of the polar group include positively charged functional groups such as ammonium and phosphonium; and acid groups which are negatively charged or may be dissociated to be negatively charged, such as sulfonate group, carboxyl group, phosphate group and phosphonate group. These polar groups adsorbs metal ions in the form of counterions of dissociative groups.

Use may also be made of nonionic polar groups such as hydroxyl group, amide group, sulfonamide group, alkoxy group and cyano group.

Other exemplary groups that may be used include imino group, primary and secondary amino groups, amide group, urethane group, hydroxyl group (also including phenol) and thiol group.

More specifically, the non-dissociative functional group is preferably a group capable of coordination with a metal ion, a nitrogen-containing functional group, a sulfur-containing functional group or an oxygen-containing functional group. Specific examples thereof include nitrogen-containing functional groups such as imide group, pyridine group, tertiary amino group, pyrrolidone group, amidino group, triazine ring structure-containing group, isocyanuric structure-containing group, nitro group, nitroso group, azo group, diazo group, azide group and cyanate group (R—O—CN); oxygen-containing functional groups such as ether group, carbonyl group, ester group, N-oxide structure-containing group and S-oxide structure-containing group; sulfur-containing functional groups such as thioether group, thioxy group, sulfoxide group, sulfite group, sulfoxyimine structure-containing group, sulfoxinium salt structure-containing group and sulfonic ester structure-containing group; phosphorus-containing functional groups such as phosphine group; and groups containing halogen atoms such as chlorine and bromine. In an embodiment showing no dissociation because of the relation with the neighboring atom or atom group, imidazole group, urea group or thiourea group may be used.

Of these, cyano group or carboxylate group is a particularly preferred interactive group because of the high polarity and high adsorptivity on plating catalysts or precursors thereof.

The method of forming the adhesive insulating layer is not particularly limited and known layer forming processes including coating, transferring and printing processes are used.

More specifically, the adhesive insulating layer may be formed by laminating a polymer having a functional group that may form an interaction with the plating catalyst or its precursor on the lower insulating layer to be described later using an extruder. The adhesive insulating layer may be formed using a composition containing the polymer (hereinafter referred to as the "adhesive insulating layer-forming composition" where appropriate). Exemplary methods in the case of using the composition include a method which involves immersing the base used in the adhesive insulating layer-forming composition and a method which involves applying the adhesive insulating layer-forming composition to the lower insulating layer to be described later.

(Lower Insulating Layer)

The lower insulating layer is a layer formed on one surface of the adhesive insulating layer included in the laminated insulating layer and serves to ensure the insulation between the metal layers in the resulting multilayer substrate.

The material making up the lower insulating layer is not particularly limited and materials making up the above-described insulating layer are used.

The lower insulating layer may be of a multilayer structure including two or more layers.

The thickness of the lower insulating layer is not particularly limited and is preferably from 10 to 200 μm and more preferably 20 to 100 μm in terms of the insulation reliability in the resulting multilayer substrate, suppression of warp and characteristic impedance.

The method of forming the lower insulating layer is not particularly limited and the same method as that used to form the insulating layer 12 can be used.

(Implementation Procedure)

The production method of the invention using the core base 310 is now described in detail with reference to FIG. 5.

Figure 5B:
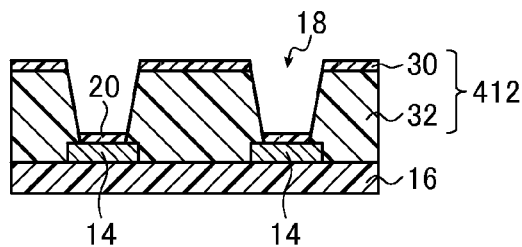

The core base 310 shown in FIG. 5A is first prepared and is subjected to the above-described boring step to form holes 18 each extending from the surface of the adhesive insulating layer 30 (surface opposite from the side on which the lower insulating layer 32 is formed) to a first metal layer 14 (FIG. 5B). Smear 20 is deposited on the bottom of the holes 18.

Figure 5C:
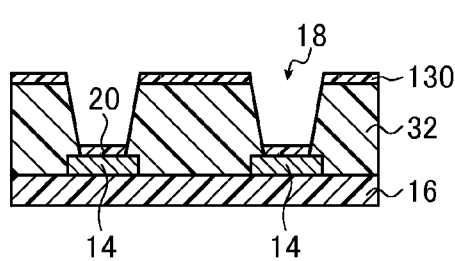

Next, the procedure described in the above-described metal deposition step is performed to obtain an adhesive insulating layer 130 on the surface of which a metal or metal ion is deposited (see FIG. 5C).

Figure 5D:
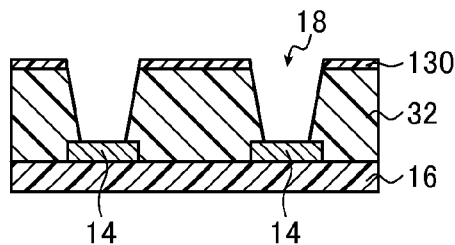

Then, the above-described desmear treatment is performed to remove the smear 20 deposited on the bottom of the holes 18 (see FIG. 5D). The metal or metal ion deposited on the surface of the adhesive insulating layer 130 suppresses damage due to plasma etching.

Figure 5E:
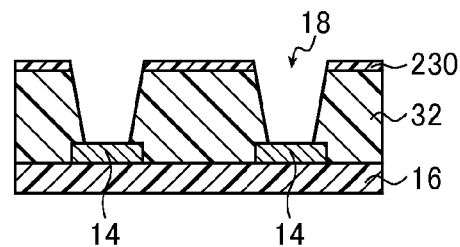

By subsequently performing the cleaning step, the metal or metal ion deposited on the adhesive insulating layer 130 is substantially removed (the adhesive insulating layer 130 having the metal or metal ion deposited thereon is turned into an insulating layer 230 in which the metal or metal ion is substantially removed) while the resin remaining on the bottom of the holes 18 and the oxide film formed on the first metal layer 14 are removed (see FIG. 5E).

Figure 5F:
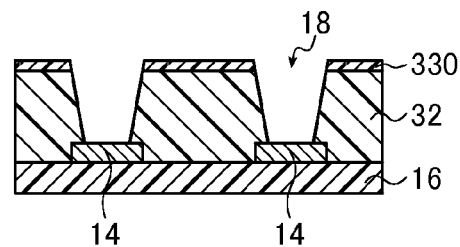

By subsequently performing the step A in the above-described plating step, an adhesive insulating layer 330 having the plating catalyst or its precursor applied thereto is obtained (FIG. 5F).

Figure 5G:
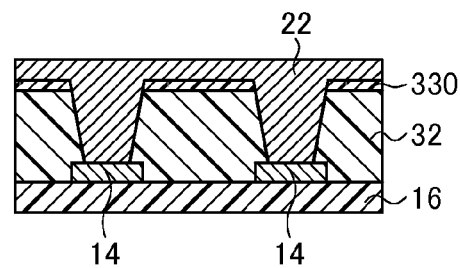

By finally performing the step B in the above-described plating step, the second metal layer 22 electrically connecting with the first metal layer 14 though the holes can be formed on the adhesive insulating layer 330 (FIG. 5G).

As described above, the second metal layer 22 formed may be patterned as needed.

Preferred Embodiment of Adhesive Insulating Layer

A preferred embodiment of the adhesive insulating layer is one formed by contacting the adhesive insulating layer-forming composition containing the polymer having a polymerizable group and a functional group that may form an interaction with the plating catalyst or its precursor with the lower insulating layer and applying energy to the adhesive insulating layer-forming composition on the lower insulating layer.

According to this embodiment, the adhesion of the second metal layer formed on the adhesive insulating layer is more excellent.

The materials (e.g., polymer) for use in this embodiment are first described in detail and the production procedure of the adhesive insulating layer is then described.

(Polymer)

The polymer used has a polymerizable group and a functional group that may form an interaction with the plating catalyst or its precursor.

The interactive group is as described above. The polymer may contain two or more types of interactive groups.

(Polymerizable Group)

The polymerizable group is a functional group capable of forming a bond between polymers or a polymer and the lower insulating layer by application of energy, and examples thereof include a radical polymerizable group and a cationic polymerizable group. Of these, a radical polymerizable group is preferable in terms of the reactivity. Examples of the radical polymerizable group include unsaturated carboxylic ester groups such as acrylic ester group, methacrylic ester group, itaconic ester group, crotonic ester group, isocrotonic ester group and maleic ester group; styryl group, vinyl group, acrylamide group and methacrylamide group. Of these, methacrylic ester group, acrylic ester group, vinyl group, styryl group, acrylamide group and methacrylamide group are preferable and acryloyl group, methacryloyl group and styryl group are most preferable.

The polymer having a polymerizable group and an interactive group is preferably a polymer obtained by introducing an addition-polymerizable ethylenically unsaturated group (polymerizable group) such as vinyl group, allyl group or (meth)acrylic group which serves as the polymerizable group into a homopolymer or copolymer obtained by using a monomer having an interactive group. The polymer having a polymerizable group and an interactive group is one having at least a polymerizable group at the end of the main chain or on the side chain and preferably having a polymerizable group on the side chain.

The method of synthesizing such a polymer having a polymerizable group and an interactive group is not particularly limited and a known synthesis method (see paragraphs [0097]-[0125] of JP 2009-280905 A) is used.

The weight-average molecular weight of the polymer is not particularly limited and is preferably at least 1,000 but not more than 700,000 and more preferably at least 2,000 but not more than 200,000. The weight-average molecular weight is most preferably 20,000 or more in terms of the polymerization sensitivity.

The degree of polymerization of the polymer is preferably 10 or more and more preferably 20 or more. The degree of polymerization is preferably up to 7,000, more preferably up to 3,000, even more preferably up to 2,000 and most preferably up to 1,000.

Preferred Embodiments

A preferred embodiment of the polymer is a polymer containing a unit (polymerizable group-containing unit) represented by formula (1) shown below. The unit contained in the polymer contributes to exhibiting an excellent adhesion between the adhesive insulating layer and the second metal layer formed thereon while a crosslinking reaction proceeds in the film, whereby a film having a high strength can be obtained.

[Chemical Formula 1]

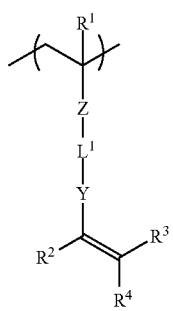

Formula (1)

In formula (1), $R^1$ to $R^4$ each independently represent a hydrogen atom or an optionally substituted alkyl group.

When $R^1$ to $R^4$ are each an optionally substituted alkyl group, an alkyl group containing 1 to 6 carbon atoms is preferred and an alkyl group containing 1 to 4 carbon atoms is more preferred. More specific examples of the unsubstituted alkyl group include methyl group, ethyl group, propyl group and butyl group. Examples of the substituted alkyl group include methyl group, ethyl group, propyl group and butyl group substituted with, for example, methoxy group.

$R^1$ is preferably a hydrogen atom or a methyl group. $R^2$ is preferably a hydrogen atom or a methyl group. $R^3$ is preferably a hydrogen atom. $R^4$ is preferably a hydrogen atom.

Y and Z each independently represent a single bond or an optionally substituted divalent organic group. Examples of the divalent organic group include optionally substituted divalent aliphatic hydrocarbon groups (preferably containing 1 to 3 carbon atoms), optionally substituted divalent aromatic hydrocarbon groups (preferably containing 6 to 12 carbon atoms), —O—, —S—, —N(R)— (R: alkyl group), —CO—, —NH—, —COO—, —CONH—, and combination groups thereof (such as alkyleneoxy group, alkyleneoxycarbonyl group and alkylenecarbonyloxy group).

Preferred examples of the optionally substituted divalent aliphatic hydrocarbon group (e.g., alkylene group) include methylene group, ethylene group, propylene group, butylene group, pentylene group, and hexylene group which are optionally substituted with, for example, methoxy group.

Preferred examples of the optionally substituted divalent aromatic hydrocarbon group include phenylene group optionally substituted with, for example, methoxy group.

Of these, —$(CH_2)_n$— where n is an integer of 1 to 3 is preferred and —$CH_2$— is more preferred.

Y and Z are each preferably an ester group (—COO—), an amide group (—CONH—), an ether group (—O—), or an optionally substituted aromatic hydrocarbon group.

$L^1$ represents a single bond or an optionally substituted divalent organic group. The divalent organic group is as defined for the organic groups represented by Y and Z and examples thereof include optionally substituted divalent aliphatic hydrocarbon groups, optionally substituted divalent aromatic hydrocarbon groups, —O—, —S—, —N(R)— (R: alkyl group), —CO—, —NH—, —COO—, —CONH—, and combination groups thereof.

$L^1$ is preferably a single bond, an unsubstituted alkylene group or a divalent organic group having a urethane bond or a urea bond (in particular an aliphatic hydrocarbon group), is more preferably an unsubstituted alkylene group or a divalent organic group having a urethane bond, and most preferably contains in total 1 to 9 carbon atoms. The total number of carbon atoms in $L^1$ refers to the total number of carbon atoms included in the optionally substituted divalent organic group represented by $L^1$.

More specifically, $L^1$ preferably has a structure represented by formula (1-1) or (1-2).

[Chemical Formula 2]

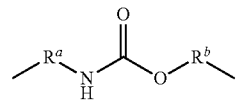

Formula (1-1)

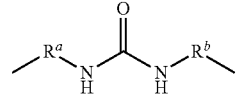

Formula (1-2)

In formulas (1-1) and (1-2), $R^a$ and $R^b$ each independently represent a divalent organic group. The divalent organic group is as defined above and preferred examples thereof include optionally substituted alkylene groups such as methylene group, ethylene group, propylene group and butylene group, and polyoxyalkylene groups such as ethylene oxide group, diethylene oxide group, triethylene oxide group, tetraethylene oxide group, dipropylene oxide group, tripropylene oxide group and tetrapropylene oxide group.

A preferred embodiment of the unit represented by formula (1) is a unit represented by formula (1-A):

[Chemical Formula 3]

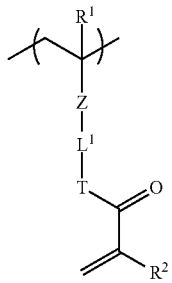

Formula (1-A)

In formula (1-A), $R^1$, $R^2$, Z and $L^1$ are as defined for the respective groups in the unit represented by formula (1). T represents an oxygen atom or NR (where R is a hydrogen atom or an alkyl group and preferably a hydrogen atom or an unsubstituted alkyl group containing 1 to 5 carbon atoms).

A preferred embodiment of the unit represented by formula (1-A) is a unit represented by formula (1-B):

[Chemical Formula 4]

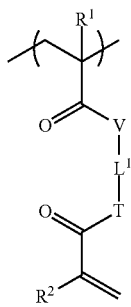

Formula (1-B)

In formula (1-B), $R^1$, $R^2$ and $L^1$ are as defined for the respective groups in the unit represented by formula (1-A). V and T represent an oxygen atom or NR (where R is a hydrogen atom or an alkyl group and preferably a hydrogen atom or an unsubstituted alkyl group containing 1 to 5 carbon atoms).

In formula (1-B), T is preferably an oxygen atom.

In formulas (1-A) and (1-B), $L^1$ is preferably an unsubstituted alkylene group or a divalent organic group having a urethane bond or a urea bond (in particular an alkylene group), more preferably a divalent organic group having a urethane bond, and most preferably contains in total 1 to 9 carbons.

The content of the unit represented by formula (1) in the polymer is not particularly limited and is preferably from 5 to 50 mol % and more preferably from 5 to 40 mol % with respect to all the units (100 mol %) in terms of the reactivity (polymerizability and curing properties) and the adhesion to the insulating layer. An amount of less than 5 mol % may reduce the reactivity (curing properties, polymerizability), whereas an amount exceeding 50 mol % facilitates gelation during polymer synthesis and hinders the reaction control.

A preferred embodiment of the polymer is a polymer containing a unit (interactive group-containing unit) represented by formula (2) shown below. The unit contained in the polymer improves the adsorption on the plating catalyst or its precursor while ensuring excellent adhesion between the adhesive insulating layer and the second metal layer.

[Chemical Formula 5]

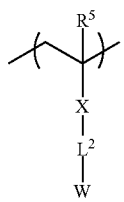

Formula (2)

In formula (2), $R^5$ represents a hydrogen atom or an optionally substituted alkyl group. The optionally substituted alkyl group represented by $R^5$ is as defined above for the optionally substituted alkyl groups represented by $R^1$ to $R^4$.

$R^5$ is preferably a hydrogen atom or a methyl group optionally substituted with a hydroxy group or a bromine atom.

X and $L^2$ each independently represent a single bond or an optionally substituted divalent organic group. The divalent organic group is as defined for the divalent organic groups represented by Z and Y and examples thereof include optionally substituted divalent aliphatic hydrocarbon groups, optionally substituted divalent aromatic hydrocarbon groups, —O—, —S—, —N(R)— (R: alkyl group), —CO—, —NH—, —COO—, —CONH—, and combination groups thereof.

X is preferably a single bond, an ester group (—COO—), an amide group (—CONH—), an ether group (—O—) or an optionally substituted aromatic hydrocarbon group, and more preferably a single bond, an ester group (—COO—), or an amide group (—CONH—).

$L^2$ is preferably a single bond, a linear, branched or cyclic alkylene group, an aromatic group, or a combination group thereof. The combination group of the alkylene group and the aromatic group may be further formed via an ether group, an ester group, an amide group, a urethane group or a urea group.

In particular, the total number of carbon atoms included in $L^2$ is preferably 1 to 15 and it is particularly preferred for $L^2$ to be unsubstituted. The total number of carbon atoms in $L^2$ refers to the total number of carbon atoms included in the optionally substituted divalent organic group represented by $L^2$.

Specific examples thereof include methylene group, ethylene group, propylene group, butylene group and phenylene group which may be optionally substituted with methoxy group, hydroxy group, chlorine atom, bromine atom, fluorine atom or the like, and combination groups thereof.

W represents a functional group (interactive group) which may interact with the plating catalyst or its precursor and is as defined above. In particular, W is preferably a cyano group or a carboxylate group in terms of excellent adsorption on the plating catalyst or its precursor.

The polymer may contain two or more types of units represented by formula (2) in which the type of W is different. The polymer preferably contains a unit represented by formula (2) in which W is a cyano group and a unit represented by formula (2) in which W is a carboxylate group because the resulting multilayer substrate exhibits more excellent connection reliability and yield.

A preferred embodiment of the unit represented by formula (2) is a unit represented by formula (2-A) or (2-B):

[Chemical Formula 6]

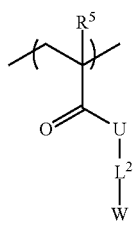

Formula (2-A)

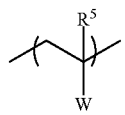

Formula (2-B)

In formula (2-A), $R^5$, $L^2$ and W are as defined for the respective groups in the unit represented by formula (2). U represents an oxygen atom or NR' (where R' is a hydrogen atom or an alkyl group and preferably a hydrogen atom or an unsubstituted alkyl group containing 1 to 5 carbon atoms).

In formula (2-A), $L^2$ is preferably a linear, branched or cyclic alkylene group, an aromatic group (in particular a divalent aromatic hydrocarbon group is preferable), or a combination group thereof.

Particularly in formula (2-A), an embodiment in which the linkage moiety of $L^2$ with W is a divalent organic group having a linear, branched or cyclic alkylene group is preferred and an embodiment in which the divalent organic group contains in total 1 to 10 carbon atoms is more preferred.

In another preferred embodiment, the linkage moiety of $L^2$ with W in formula (2-A) is preferably a divalent organic group having an aromatic group and the divalent organic group more preferably contains in total 6 to 15 carbon atoms.

In formula (2-B), $R^5$ and W are as defined for the respective groups in the unit represented by formula (2).

The content of the unit represented by formula (2) in the polymer is not particularly limited and is preferably from 5 to 94 mol % and more preferably from 10 to 80 mol % with respect to all the units (100 mol %) in terms of the adsorptivity on the plating catalyst or the like.

The linking mode of the respective units in the polymer is not particularly limited and the polymer may be a random polymer formed by random linking of the units or a block polymer in which each unit of the same type is repeatedly linked to form a block.

The polymer may contain a unit other than the above-described unit represented by formula (1) and the above-described unit represented by formula (2) as long as the effects of the invention are not impaired.

(Adhesive Insulating Layer-Forming Composition)

The adhesive insulating layer-forming composition contains the above-described polymer.

The content of the polymer in the adhesive insulating layer-forming composition is not particularly limited and is preferably from 2 to 50 wt % and more preferably from 5 to 30 wt % with respect to the total amount of the composition. When the polymer content is within the above ranges, the composition is handled with ease and the thickness of the adhesive insulating layer is easily controlled.

In addition to the polymer, the adhesive insulating layer-forming composition may optionally contain a solvent.

Examples of the solvent that may be used include alcoholic solvents such as methanol, ethanol, propanol, ethylene glycol, glycerin and propylene glycol monomethyl ether; acids such as acetic acid; ketone solvents such as acetone, methyl ethyl ketone and cyclohexanone; amide solvents such as formamide, dimethylacetamide and N-methylpyrrolidone; nitrile solvents such as acetonitrile and propionitrile; ester solvents such as methyl acetate and ethyl acetate; and carbonate solvents such as dimethyl carbonate and diethyl carbonate. Other exemplary solvents include ether solvents, glycolic solvents, amine solvents, thiol solvents and halogenated solvents.

Of these, amide solvents, ketone solvents, nitrile solvents, and carbonate solvents are preferable and more specifically acetone, dimethylacetamide, methyl ethyl ketone, cyclohexanone, acetonitrile, propionitrile, N-methylpyrrolidone and dimethyl carbonate are preferable.

The content of the solvent in the adhesive insulating layer-forming composition is not particularly limited and is preferably from 50 to 98 wt % and more preferably from 70 to 95 wt % with respect to the total amount of the composition. When the solvent content is within the above ranges, the composition is handled with ease and the thickness of the adhesive insulating layer is easily controlled.

Additives such as a surfactant, a plasticizer, a polymerization inhibitor, a curing agent, a radical generator, a sensitizer, a rubber ingredient (e.g., CTBN), a flame retardant (e.g., phosphorus flame retardant), a diluent, a thixotropic agent, a pigment, an antifoaming agent, a leveling agent and a coupling agent may be further added to the adhesive insulating layer-forming composition.

(Step Procedure)

The method used to contact the above-described adhesive insulating layer-forming composition with the lower insulating layer is not particularly limited and exemplary methods include a method which involves directly laminating the adhesive insulating layer-forming composition on the lower insulating layer and a method which involves applying the adhesive insulating layer-forming composition to the lower insulating layer when the composition is in the state of a liquid containing a solvent. The method which involves applying the composition is preferable because the thickness of the resulting adhesive insulating layer is easily controlled.

The coating process is not particularly limited and specific examples thereof include known processes such as a coating process using a double roll coater, a slit coater, an air knife coater, a wire bar coater, a slide hopper, a spray coater, a blade coater, a doctor coater, a squeeze coater, a reverse roll coater, a transfer roll coater, an extrusion coater, a curtain coater, a die coater or a gravure roll, an extrusion coating process, and a roll coating process.

The embodiment in which the adhesive insulating layer-forming composition is applied onto the lower insulating layer and dried and the remaining solvent is removed to form the polymer-containing composition layer is preferable in terms of the ease of handling and the manufacturing efficiency.

In cases where the adhesive insulating layer-forming composition is contacted with the lower insulating layer, the coating weight in terms of solid content is preferably from 0.1 g/m$^2$ to 10 g/m$^2$ and most preferably from 0.5 g/m$^2$ to 5 g/m$^2$ in terms of the formation of a sufficient interaction with the plating catalyst or its precursor.

Upon formation of the adhesive insulating layer in this step, the core base may be left to stand at 20 to 40° C. for 0.5 to 2 hours between the application and the drying to remove the remaining solvent.

(Application of Energy)

The method of applying energy to the adhesive insulating layer-forming composition on the lower insulating layer (or on the support) is not particularly limited and, for example, heating and exposure to light are preferably used.

Irradiation with light from a UV lamp or with visible light is used for exposure. Exemplary light sources include mercury lamp, metal halide lamp, xenon lamp, chemical lamp, and carbon arc lamp. Examples of the radiation include electron rays, X-rays, ion beams and far infrared rays. In addition, g-line rays, i-line rays, deep UV rays, and high-density energy beams (laser beams) may also be used.

Preferred specific examples of the exposure technique that may be commonly used include scanning exposure with an infrared laser, high-intensity flash exposure with a xenon discharge lamp and exposure with an infrared lamp.

The exposure time varies with the reactivity of the polymer and the light source used and is typically from 10 seconds to 5 hours. The exposure energy is in a range of about 10 to about 8,000 mJ and preferably 100 to 3,000 mJ.

In cases where heating is used to apply energy, devices such as an air dryer, an oven, an infrared dryer and a heating drum may be used.

The configuration disclosed in the core base 310 shown in FIG. 5A includes the adhesive insulating layer 30, the lower insulating layer 32, the first metal layer 14 and the support 16 but the embodiment of the core base 310 is not limited to this as long as the adhesive insulating layer 30 is at a predetermined position in the insulating layer.

According to an exemplary embodiment, a multilayer laminate (laminate substrate) in which a plurality of (two or more) insulating layers and metal layers are alternately disposed, one of the insulating layers is disposed at the uppermost surface and an adhesive insulating layer is disposed as the uppermost layer of the insulating layer is used as the core base. The adhesive insulating layer may be disposed as the uppermost layer of each insulating layer.

In the multilayer laminate, metal layers disposed above and below the insulating layer may be electrically connected with each other via a through conductor formed in the insulating layer lying between the metal layers.

Figure 6:
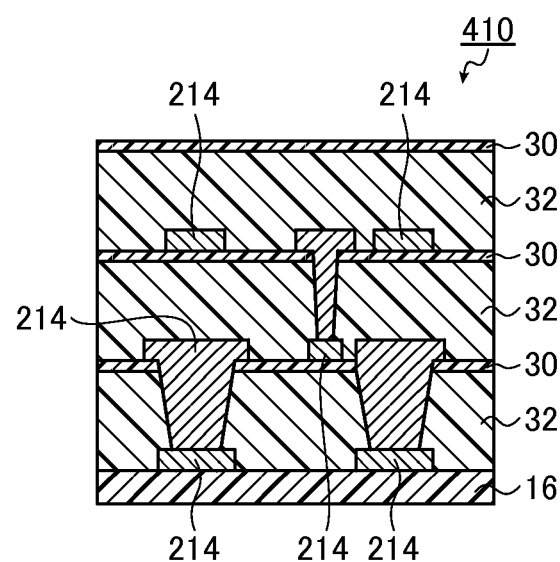
FIG. 6 is a schematic cross-sectional view showing another embodiment of the core base that may be used in the invention.

More specifically, a core base (laminate substrate) 410 as shown in FIG. 6 may be used in which three laminated insulating layers each including an adhesive insulating layer 30 and a lower insulating layer 32 and three patterned metal layers 214 are stacked on a support 16.

EXAMPLES

The invention is described below in further detail by way of examples. However, the invention should not be construed as being limited to the following examples.

The polymer synthesis method for use in Examples is described below in detail.

Synthesis Example 1

Polymer A

Into a three-necked flask with a volume of 2 L were introduced 1 L of ethyl acetate and 159 g of 2-aminoethanol and the mixture was cooled in an ice bath. To the mixture was added dropwise 150 g of 2-bromoisobutyryl bromide while adjusting the internal temperature to 20° C. or less. Then, the internal temperature was raised to room temperature (25° C.) and the reaction was allowed to take place for 2 hours. After the end of the reaction, 300 mL of distilled water was added to quench the reaction. Then, the ethyl acetate layer was washed with 300 mL of distilled water four times and dried over magnesium sulfate. Ethyl acetate was further distilled off to yield 80 g of Material A.

Next, 47.4 g of Material A, 22 g of pyridine and 150 mL of ethyl acetate were introduced into a three-necked flask with a volume of 500 mL and the mixture was cooled in an ice bath. To the mixture was added dropwise 25 g of acrylyl chloride while adjusting the internal temperature to 20° C. or less. Then, the temperature was raised to room temperature and the reaction was allowed to take place for 3 hours. After the end of the reaction, 300 mL of distilled water was added to quench the reaction. Then, the ethyl acetate layer was washed with 300 mL of distilled water four times and dried over magnesium sulfate. Ethyl acetate was further distilled off. Then, the distillate was purified by column chromatography to obtain 20 g of Monomer M shown below.

[Chemical Formula 7]

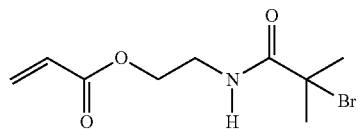

Into a three-necked flask with a volume of 500 mL was introduced 8 g of N,N-dimethylacetamide, which was heated to 65° C. in a nitrogen stream. A solution of 14.3 g of Monomer M, 3.0 g of acrylonitrile (Tokyo Chemical Industry Co., Ltd.), 6.5 g of acrylic acid (Tokyo Chemical Industry Co., Ltd.), and 0.4 g of V-65 (Wako Pure Chemical Industries, Ltd.) in 8 g of N,N-dimethylacetamide was added dropwise over 4 hours.

After the completion of the dropwise addition, the reaction solution was further stirred for 3 hours. Then, 41 g of N,N-dimethylacetamide was added and the reaction solution was cooled to room temperature. To the reaction solution were added 0.09 g of 4-hydroxy-TEMPO (Tokyo Chemical Industry Co., Ltd.) and 54.8 g of DBU and the mixture was reacted at room temperature for 12 hours. Then, to the reaction solution was added 54 g of a 70 wt % aqueous solution of methanesulfonic acid. After the end of the reaction, the reaction solution was reprecipitated with water. The solid was recovered to obtain 12 g of Polymer A (weight-average molecular weight: 34,000) (Mw/Mn=1.8). The acid number of Polymer A obtained was measured in an automatic potentiometric titrator (Kyoto Electronics Manufacturing Co., Ltd.) using a 0.1 M aqueous sodium hydroxide solution as the titrant and the measured acid number of Polymer A was 3.9 mmol/g.

The resulting Polymer A was identified with an infrared meter (HORIBA, Ltd.). The polymer was dissolved in acetone and KBr crystals were used to perform the measurement. As a result of the IR measurement, a peak was observed at around 2240 cm$^{-1}$ and it was shown that acrylonitrile which is a nitrile unit was introduced into the polymer. The acid number measurement showed that acrylic acid which is a carboxylic acid unit was introduced into the polymer. The polymer was also dissolved in deuterated DMSO (dimethyl sulfoxide) and measured by NMR (AV-300) (Bruker, 300 MHz). A broad peak corresponding to the nitrile group-containing unit was observed at 2.5-0.7 ppm (5H), broad peaks corresponding to the polymerizable group-containing unit were observed at 7.8-8.1 ppm (1H), 5.8-5.6 ppm (1H), 5.4-5.2 ppm (1H), 4.2-3.9 ppm (2H), 3.3-3.5 ppm (2H) and 2.5-0.7 ppm (6H), and a broad peak corresponding to the carboxylic acid-containing unit was observed at 2.5-0.7 ppm (3H), and it was revealed that the ratio between the polymerizable group-containing unit:nitrile group-containing unit:carboxylic acid group unit was 30:30:40 (mol %).

[Chemical Formula 8]

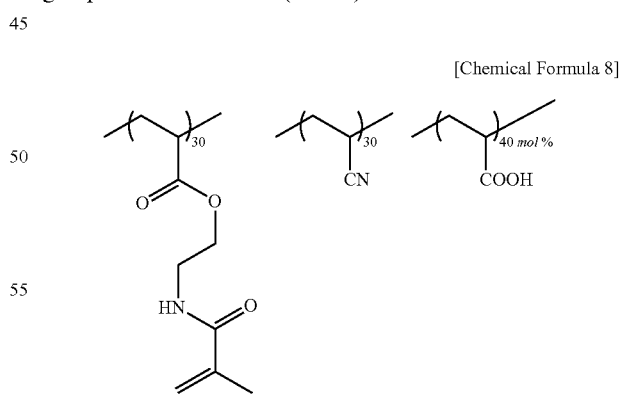

Example 1

1. Preparation of Insulating Layer

An epoxy insulating film ABF GX-13 (Ajinomoto Fine-Techno Co., Inc.; film thickness: 40 μm) which served as an electric insulating layer was adhered to a glass epoxy substrate on which a first patterned metal layer (land diameter: 150 μm)(copper foil) had been formed in advance, by a vacuum laminator under heating at 100 to 110° C. and pressure at 0.2 MPa, thereby forming a lower insulating layer.

A 7% solution of Polymer A in acetonitrile (adhesive insulating layer-forming composition) was applied onto the lower insulating layer with a spin coater (at 300 rpm for 5 seconds and then at 750 rpm for 20 seconds) and dried at 80° C. for 30 minutes. After drying, a UV exposure device (San-Ei Electric Co., Ltd.; type: UVF-502S; lamp: UXM-501MD) was used to expose the adhesive insulating layer-forming composition through a quartz mask with an irradiation power of 10 mW/cm$^2$ (the irradiation power was measured by an accumulated UV meter UIT150 and a photosensor UVD-S254; Ushio Inc.) for 100 seconds to form an adhesive insulating layer on the whole surface of the lower insulating layer. The accumulated amount of exposure was 500 mJ.

Then, the substrate was immersed in acetonitrile being stirred for 5 minutes and was subsequently washed with distilled water. A core base having the adhesive insulating layer disposed as the uppermost layer (outermost layer) of the insulating layer was thus obtained. The adhesive insulating layer had a thickness of 0.3 μm.

2. Boring Step

The insulating layer having the lower insulating layer and the adhesive insulating layer which had been obtained in the above step was bored by a carbon dioxide laser (Hitachi, Ltd.; LC-2E21B/1C) to form holes (via holes) with a diameter of 60 μm reaching the copper foil (first metal layer) at predetermined positions.

3. Metal Deposition Step

The core base having undergone the foregoing boring was immersed in a 5 wt % aqueous silver nitrate solution (plating catalyst solution) at room temperature for 15 minutes. The amount of silver ions adsorbed on the adhesive insulating layer was 400 mg/m$^2$.

4. Desmearing Step

A plasma treatment machine (MW-DF system; Nissin Inc.) was used to perform dry desmearing for 90 seconds on the core base having silver ions deposited on the adhesive insulating layer.

5. Cleaning Step

The core base having undergone the desmear treatment was washed with a 10% aqueous sulfuric acid solution (40° C.) for 20 minutes. Silver ions remained on the washed adhesive insulating layer in an amount of not more than 0.5 mg/m$^2$ which is the detection limit.

6. Electroless Plating Step (Application of Plating Catalyst)

After the cleaning step, the surface of the resulting core base was subjected to alkali degreasing treatment and the thus obtained core base was immersed in a 0.05 wt % solution of palladium nitrate in acetone for 30 minutes and washed with acetone and distilled water each for 1 to 2 minutes.

(Electroless Plating Treatment)

THRU-CUP PGT (C. Uyemura & Co., Ltd.) and an electroless plating bath of the composition shown below were used to perform electroless plating at a temperature of 26° C. for 60 minutes on the core base to which the plating catalyst had been applied as described above, thereby obtaining a multilayer substrate having an electroless copper plated layer (second metal layer) on the surface of the adhesive insulating layer. The thickness of the resulting electroless copper plated layer (thickness from the surface of the adhesive insulating layer to the surface of the second metal layer) was 1.0 μm. The second metal layer electrically connected with the first metal layer through the holes formed in the boring step (see FIG. 2B).

The preparation order and materials of the electroless plating solution are as follows:

| | |
|---|---|
| Distilled water | about 60 vol % |
| PGT-A | 9.0 vol % |
| PGT-B | 6.0 vol % |
| PGT-C | 3.5 vol % |
| Formalin solution* | 2.3 vol % |

Finally, the solution level was adjusted with distilled water so that the total amount may be 100 vol %.
*Formalin used herein is a formaldehyde solution (special grade) available from Wako Pure Chemical Industries, Ltd.

7. Filling Plating and Interconnect Patterning Step

The surface of the electroless copper plated layer was washed with a 1% aqueous sulfuric acid solution and a dry film resist (ALPHO NIT3025: Nichigo-Morton Co., Ltd.) was laminated thereon at a temperature of 110±10° C. and a pressure of 0.35±0.05 MPa. As for the printing of a circuit pattern, pattern exposure was performed by irradiation with uv light at 120 mJ/cm$^2$ from an ultrahigh pressure mercury lamp based on the guide holes and the dry film resist was then developed using a 1% aqueous sodium carbonate solution at 30° C. and a spray pressure of 0.15 MPa to thereby form a plated resist pattern (see FIG. 2C).

The second conductive layer was used as the power supply layer to perform electroplating at 2.2 A/dm$^2$ for 25 minutes in the copper electroplating bath of the composition indicated below. The thickness of the resulting electroplated copper layer (thickness from the surface of the adhesive insulating layer to the surface of the electroplated copper layer) was 20 μm (see FIG. 2D).

(Composition of Electroplating Bath)

| | |
|---|---|
| Copper sulfate | 38 g |
| Sulfuric acid | 95 g |
| Hydrochloric acid | 1 mL |
| Copper Gleam PCM (Meltex Inc.) | 3 mL |
| Water | 500 g |

A 4 wt % aqueous sodium hydroxide solution was used as the resist stripper and a spray pressure of 0.2 MPa was applied to the surface at 80° C. for 100 seconds to strip and remove the plated resist pattern (see FIG. 2E). Then, a hydrogen peroxide/sulfuric acid type soft etching solution was used to remove the copper used as the undercoat conductive layer in portions where the circuit pattern was not formed, thereby preparing a multilayer substrate having an interconnect pattern ((see FIG. 2F)). The interconnect pattern formed had a line width of 15 μm and a line-to-line spacing of 15 μm.

Example 2

The procedure of Example 1 was repeated except that the 10% aqueous sulfuric acid solution was replaced by a 10% aqueous nitric acid solution in [5. Cleaning Step], thereby forming a multilayer substrate. Silver ions remained on the washed adhesive insulating layer in an amount of not more than 0.5 mg/m² which is the detection limit.

Example 3

The procedure of Example 1 was repeated except that, in [3. Metal Deposition Step], the 5 wt % aqueous silver nitrate solution was replaced by a 0.05 wt % aqueous silver nitrate solution, and the core base was immersed in this aqueous solution at room temperature for 3 minutes to adsorb silver ions on the adhesive insulating layer in an amount of 60 mg/m², thereby forming a multilayer substrate.

Example 4

The procedure of Example 1 was repeated except that, in [3. Metal Deposition Step], the 5 wt % aqueous silver nitrate solution was replaced by a 5 wt % aqueous copper acetate solution, and the core base was immersed in this aqueous solution at room temperature for 3 minutes to adsorb divalent copper ions on the adhesive insulating layer in an amount of 200 mg/m², thereby forming a multilayer substrate.

Example 5

The procedure of Example 1 was repeated except that, in [3. Metal Deposition Step], the 5 wt % aqueous silver nitrate solution was replaced by a 0.5% palladium acetate, and the core base was immersed in this aqueous solution at room temperature for 15 minutes to adsorb divalent palladium ions on the adhesive insulating layer in an amount of 205 mg/m², thereby forming a multilayer substrate.

Example 6

The procedure of Example 1 was repeated except that, in [3. Metal Deposition Step], the 5 wt % aqueous silver nitrate solution was replaced by a 5 wt % aqueous zinc acetate solution, and the core base was immersed in this aqueous solution at room temperature for 15 minutes to adsorb zinc ions on the adhesive insulating layer in an amount of 180 mg/m², thereby forming a multilayer substrate.

Example 7

The procedure of Example 1 was repeated except that, in [3. Metal Deposition Step], the 5 wt % aqueous silver nitrate solution was replaced by a 5 wt % aqueous aluminum sulfate solution, and the core base was immersed in this aqueous solution at room temperature for 15 minutes to adsorb aluminum ions on the adhesive insulating layer in an amount of 140 mg/m², thereby forming a multilayer substrate.

Comparative Example 1

The procedure of Example 1 was repeated except that, in [3. Metal Deposition Step], the 5 wt % aqueous silver nitrate solution was replaced by a 5 wt % aqueous potassium hydroxide solution, and the core base was immersed in this aqueous solution at room temperature for 15 minutes to adsorb potassium ions on the adhesive insulating layer in an amount of 410 mg/m², thereby forming a multilayer substrate.

Comparative Example 2

The procedure of Example 1 was repeated except that, in [3. Metal Deposition Step], the 5 wt % aqueous silver nitrate solution was replaced by a 5 wt % aqueous cesium hydroxide solution, and the core base was immersed in this aqueous solution at room temperature for 15 minutes to adsorb cesium ions on the adhesive insulating layer in an amount of 400 mg/m², thereby forming a multilayer substrate.

Comparative Example 3

The procedure of Example 1 was repeated except that, in [3. Metal Deposition Step], the 5 wt % aqueous silver nitrate solution was replaced by a 5 wt % aqueous calcium chloride solution, and the core base was immersed in this aqueous solution at room temperature for 15 minutes to adsorb calcium ions on the adhesive insulating layer in an amount of 190 mg/m², thereby forming a multilayer substrate.

Comparative Example 4

The procedure of Example 1 was repeated except that, in [3. Metal Deposition Step], the 5 wt % aqueous silver nitrate solution was replaced by a 5 wt % aqueous magnesium chloride solution, and the core base was immersed in this aqueous solution at room temperature for 15 minutes to adsorb magnesium ions on the adhesive insulating layer in an amount of 185 mg/m², thereby forming a multilayer substrate.

Comparative Example 5

The procedure of Example 1 was repeated except that [3. Metal Deposition Step] was not performed, thereby manufacturing a multilayer substrate.

Various Evaluations (Measurement of Residual Film Ratio of Adhesive Insulating Layer after Desmearing Step)

The thickness of the adhesive insulating layer before and after [4. Desmearing Step] was measured by cross-sectional observation using a field emission scanning electron microscope (Hitachi High-Technologies Corporation; SU8000) and the residual film ratio {(thickness of adhesive insulating layer after desmearing step/thickness of adhesive insulating layer before desmearing step)×100} was determined. All the results are shown in Table 1.

The thickness shown is an average value of measurements at any 30 or more points.

(Peel Strength)

[6. Electroless Plating Step] performed in each of Examples and Comparative Examples was directly followed by electroplating (current density: 2.2 A/dm²; time: 60 minutes) without performing the dry film resist step in [7. Patterning Step], thereby obtaining a uniformly plated substrate with a copper thickness of 20 μm. Then, this substrate was heat-treated at 180° C. for 60 minutes and subjected to the 90° peel test according to JIS C 6471. All the results are shown in Table 1.

The peel strength is preferably at least 0.6 kN/m in terms of practical utility.

(Patternability)

For the interconnect pattern obtained in each of Examples and Comparative Examples and having a line width of 15 μm and a line-to-line spacing of 15 μm, 200 interconnects were observed by a microscope. Each interconnect having short circuit, disconnection or interconnect delamination was deemed to be defective and the pattern failure rate (%) {(number of interconnects deemed to be defective/200)×100} was calculated.

In terms of practical utility, the pattern failure rate is preferably up to several % also in laboratory scale products.

(Via-Filling Properties)

Via holes obtained in each of Examples and Comparative Examples were polished to expose their cross-section (the number of via holes: 100) to observe the state of filling with a scanning electron microscope (Hitachi High-Technologies Corporation; S-3700N). A case in which there were voids in a via hole or a case in which there was a failure of plating connection was deemed to be a failure of filling and the via-filling failure rate (%) {(number of via holes deemed to be defective/100)×100} was calculated.

The via-filling failure rate is preferably up to 0.3% in terms of practical utility.

TABLE 1

|      | Residual film ratio of adhesive insulating layer | Peel strength (kN/m) | Pattern failure rate | Via-filling failure rate |
|------|--------------------------------------------------|----------------------|----------------------|--------------------------|
| EX 1 | 100%                                             | 0.82                 | 0%                   | 0%                       |
| EX 2 | 100%                                             | 0.84                 | 0%                   | 0%                       |
| EX 3 | 100%                                             | 0.83                 | 0%                   | 0%                       |
| EX 4 | 100%                                             | 0.85                 | 0%                   | 0%                       |
| EX 5 | 100%                                             | 0.86                 | 0%                   | 0%                       |
| EX 6 | 88%                                              | 0.73                 | 1%                   | 0%                       |
| EX 7 | 85%                                              | 0.71                 | 1%                   | 0%                       |
| CE 1 | 34%                                              | 0.41                 | 36%                  | 15%                      |
| CE 2 | 26%                                              | 0.33                 | 64%                  | 18%                      |
| CE 3 | 31%                                              | 0.24                 | 75%                  | 35%                      |
| CE 4 | 22%                                              | 0.21                 | 78%                  | 32%                      |
| CE 5 | 0%                                               | 0.05                 | 100%                 | 96%                      |

As shown in Examples 1 to 7, when the production method of the invention was used to produce the multilayer substrates, the second metal layer formed had excellent adhesion and patternability (high definition properties) with good via-filling properties.

More excellent effects were obtained particularly when transition metal elements of Groups 10 and 11 of the Periodic Table, such as copper, silver and palladium were used.

On the other hand, as shown in Comparative Examples 1 to 4, when alkali metals and alkaline-earth metals were deposited, the effect of suppressing the reduction in film thickness due to dry desmearing was slightly seen. However, the adhesion was significantly reduced, which considerably deteriorated the patternability and via-filling properties.

In addition, as shown in Comparative Example 5, when plasma etching was performed without depositing metal or metal ion, the adhesive insulating layer was completely removed. In Comparative Example 5, deposits were formed by plating but the peel strength was extremely low. In addition, the interconnect pattern was not formed at all and also in via filling, the plated film came off during electroplating presumably because of its low peel strength and filling plating itself could hardly be performed.

What is claimed is:

1. A method for producing a multilayer substrate, comprising:
    a base pretreatment step in which two steps are performed in random order, the two steps including a boring step for boring a core base having at least an insulating layer disposed as an uppermost layer and a first metal layer provided on one surface of the insulating layer to form in the insulating layer holes each extending from the other surface of the insulating layer to the first metal layer, and a metal deposition step for depositing a metal selected from the group consisting of metals having an atomic number of 13 to 14, 21 to 33 and 39 to 50 or an ion thereof on the other surface of the insulating layer;
    a desmearing step for performing desmear treatment by plasma etching after the base pretreatment step;
    a cleaning step for cleaning the core base with an acidic solution after the desmearing step; and
    a plating step for applying a plating catalyst or its precursor to the insulating layer to perform plating treatment to thereby form on the insulating layer a second metal layer electrically connecting with the first metal layer through the holes.

2. The method for producing the multilayer substrate according to claim 1, wherein the acidic solution contains hydrochloric acid, sulfuric acid or nitric acid.

3. The method for producing the multilayer substrate according to claim 2, wherein the metal or the ion thereof is deposited in the metal deposition step in an amount of 50 to 1,000 mg/m$^2$.

4. The method for producing the multilayer substrate according to claim 2, wherein the insulating layer is one including, as its uppermost layer, at least an adhesive insulating layer having a functional group that may interact with the plating catalyst or its precursor.

5. The method for producing the multilayer substrate according to claim 2, wherein the core base is bored by drilling or laser machining.

6. The method for producing the multilayer substrate according to claim 1, wherein the metal or the ion thereof is deposited in the metal deposition step in an amount of 50 to 1,000 mg/m$^2$.

7. The method for producing the multilayer substrate according to claim 6, wherein the insulating layer is one including, as its uppermost layer, at least an adhesive insulating layer having a functional group that may interact with the plating catalyst or its precursor.

8. The method for producing the multilayer substrate according to claim 6, wherein the core base is bored by drilling or laser machining.

9. The method for producing the multilayer substrate according to claim 1, wherein the insulating layer is one including, as its uppermost layer, at least an adhesive insulating layer having a functional group that may interact with the plating catalyst or its precursor.

10. The method for producing the multilayer substrate according to claim 9, wherein the core base is bored by drilling or laser machining.

11. The method for producing the multilayer substrate according to claim 1, wherein the core base is bored by drilling or laser machining.

* * * * *